US008170000B2

(12) United States Patent
Chance et al.

(10) Patent No.: US 8,170,000 B2
(45) Date of Patent: May 1, 2012

(54) METHOD AND APPARATUS FOR AUTOMATIC FREQUENCY CORRECTION IN A MULTIMODE DEVICE

(75) Inventors: Gregory W. Chance, Round Lake Beach, IL (US); Stephane L Baills, Toulouse (FR); Armin W Klomsdorf, Libertyville, IL (US); Christopher N Kurby, Streamwood, IL (US)

(73) Assignee: Motorola Mobility, Inc., Libertyville, IL (US)

( * ) Notice: Subject to any disclaimer, the term of this patent is extended or adjusted under 35 U.S.C. 154(b) by 448 days.

(21) Appl. No.: 12/429,878

(22) Filed: Apr. 24, 2009

(65) Prior Publication Data

US 2009/0227248 A1    Sep. 10, 2009

(30) Foreign Application Priority Data

Nov. 2, 2006  (EP) .................................... 06301112

(51) Int. Cl.
*H04J 3/06* (2006.01)
*H04M 1/00* (2006.01)
*H04B 1/7087* (2011.01)

(52) U.S. Cl. ................ 370/350; 370/503; 455/502

(58) Field of Classification Search .......... 370/503, 370/324, 350; 375/355, 356, 376; 455/260, 455/146, 147, 148
See application file for complete search history.

(56) References Cited

U.S. PATENT DOCUMENTS

| 5,111,162 | A | 5/1992 | Hietala et al. | |
|---|---|---|---|---|
| 6,356,599 | B1 | 3/2002 | Lee | |
| 6,728,525 | B1 | 4/2004 | Leizerovich et al. | |
| 6,754,495 | B2 * | 6/2004 | Kusaki et al. | 455/436 |
| 7,450,543 | B2 * | 11/2008 | Laroia et al. | 370/331 |
| 7,606,541 | B1 * | 10/2009 | Nicholls et al. | 455/147 |
| 7,773,962 | B2 * | 8/2010 | Sutskover et al. | 455/130 |
| 2002/0049075 | A1 | 4/2002 | Takagi | |
| 2002/0126706 | A1 * | 9/2002 | Laroia et al. | 370/503 |
| 2004/0102172 | A1 | 5/2004 | Hendin | |
| 2006/0135105 | A1 * | 6/2006 | Jensen | 455/260 |
| 2008/0077820 | A1 * | 3/2008 | Jensen et al. | 713/500 |

FOREIGN PATENT DOCUMENTS

| EP | 1206039 A2 | 5/2002 |
|---|---|---|
| GB | 2387507 A | 10/2003 |
| WO | 2004030232 A1 | 4/2004 |

* cited by examiner

*Primary Examiner* — Raj Jain
*Assistant Examiner* — Emmanuel Maglo

(57) ABSTRACT

A method and apparatus for synchronizing a system clock with a serving cell (102) associated with a first radio access technology and monitoring an adjacent cell (104) associated with a second radio access technology is provided. A communication device (100) includes a first synchronization device (205) capable of synchronization with the serving cell (102) and a second synchronization device (206) capable of independently synchronizing with the adjacent cell (104). The first synchronization device (205) and second synchronization device (206) include independent frequency correction modules (207,208). Thus, the second frequency synchronization device (206) may be corrected per the adjacent cell (104) while the first synchronization device (205) remains synchronized with the serving cell (102). Thus, the same corrected system clock may be used between two radio access technologies.

10 Claims, 7 Drawing Sheets

METHOD AND APPARATUS FOR AUTOMATIC FREQUENCY CORRECTION IN A MULTIMODE DEVICE

BACKGROUND

1. Technical Field

This invention relates generally to frequency correction in wireless communication devices, and more particularly to a method and apparatus utilizing a single system clock for communicating with multiple radio access technologies.

2. Background Art

Mobile communication devices, such as mobile telephones, communicate with towers and base stations by synchronizing internal circuitry with a communication signal being delivered by a serving cell, tower, or base station. These devices perform the synchronization by adjusting or correcting the frequency of an internal oscillator so as to align the internal oscillator with the frequency of a carrier signal associated with the serving equipment. For example, a mobile telephone that is in communication with a cell tower will frequency correct its internal oscillator so as to be frequency and time synchronized with the tower carrier signal while a call is in progress.

In a traditional mobile telephone, synchronization of a frequency synthesizer is performed to allow proper modulation or demodulation of the communication signal and synchronization of a system clock is performed to maintain proper time alignment with the serving equipment. The frequency synchronization is often performed by a pair of phase locked loops working as frequency synthesizers. A first phase locked loop is synchronized with the base station carrier signal for proper modulation or demodulation of the communication signal, while a second phase locked loop frequency synchronizes a system clock which is used to keep track of system time critical events. Such a system works well for mobile telephones configured to communicate with a single radio access technology, such as TDMA, CDMA, GSM, WLAN, or WiMAX.

In today's mobile society, people often travel from state to state and country to country. When traveling from one region to another, people sometimes travel into areas being served by radio access technology networks different from the radio access technology they typically use. For instance, a person with a CDMA phone may travel into an area being served by a GSM network. As the carrier and modulation frequencies associated with CDMA and GSM technologies are different, a conventional CDMA mobile phone will not be capable of communicating with the GSM network. Consequently, the need for a mobile communication device capable of communicating with multiple technologies has arisen.

The problem with this need is that to be able to communicate with multiple radio access technologies, a mobile device must have circuitry capable of communicating with multiple carrier signal types, each of which may have different carrier frequencies and different modulation systems. One proposed solution to this problem is to equip the mobile device with redundant communication circuitry. A multimode device may employ multiple system clocks, multiple frequency correction devices for the system clocks, multiple modulators and demodulators, and multiple frequency correction devices for the modulators and demodulators. While such a system works in practice, it is expensive to manufacture in that duplicate components must be added to each device. Further, the duplication of components increases the overall size of the device. Additionally, the mean time between failures of these devices is reduced, as a higher component count offers more opportunities for any one part to malfunction.

There is thus a need for an improved apparatus and method capable of communicating with multiple radio access technologies without the need of duplicative communication circuits.

Figure 1:
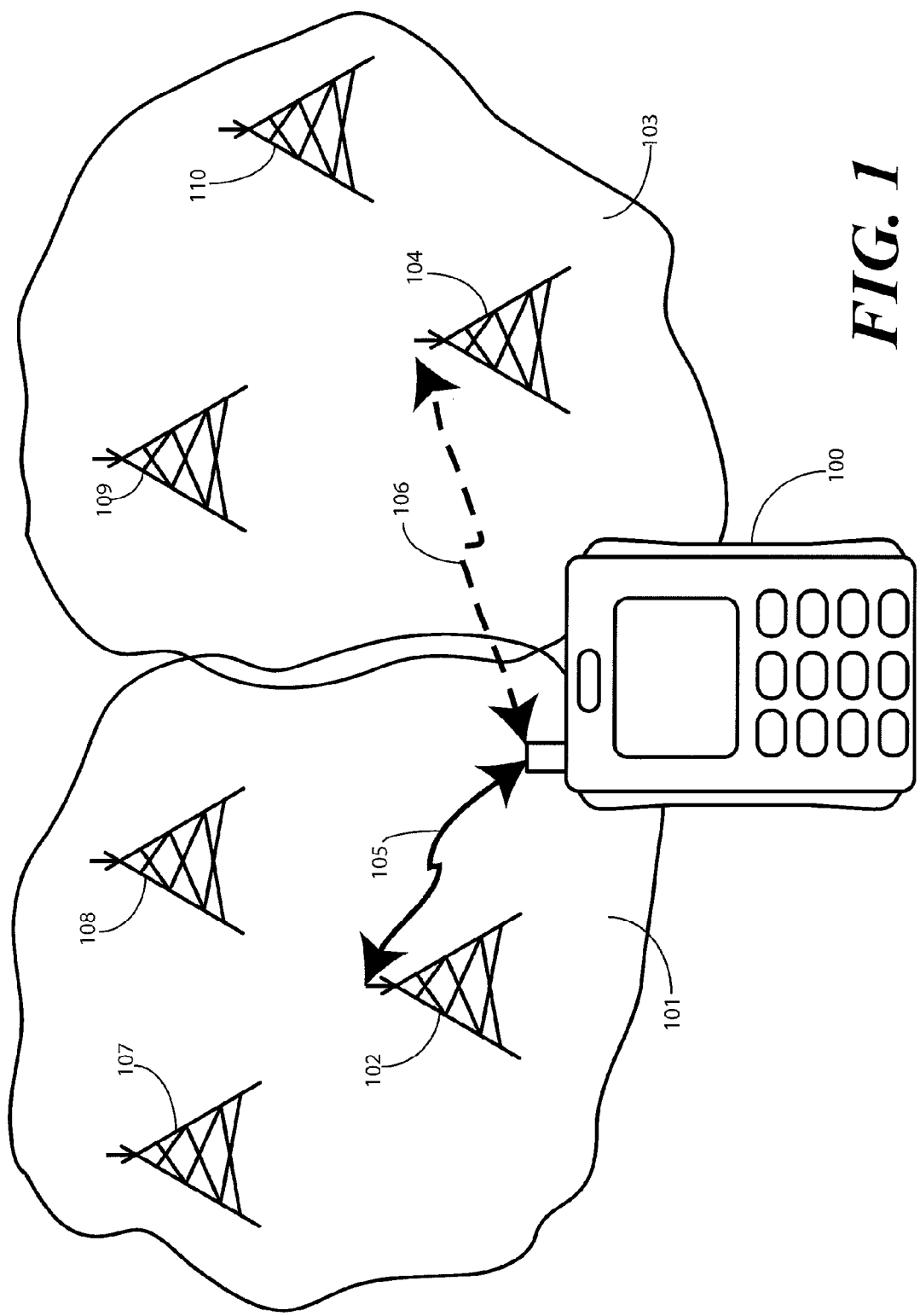
FIG. 1 illustrates a multimode device in accordance with one embodiment of the invention in communication with networks having different radio access technologies associated therewith.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE INVENTION

Before describing in detail embodiments that are in accordance with the present invention, it should be observed that the embodiments reside primarily in combinations of method steps and apparatus components related to monitoring, accessing, or communicating with multiple radio access technologies. Accordingly, the apparatus components and method steps have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

It will be appreciated that embodiments of the invention described herein may be comprised of one or more conventional processors and unique stored program instructions that control the one or more processors to implement, in conjunction with certain non-processor circuits, some, most, or all of the functions of monitoring, accessing, or communicating with heterogeneous radio access technologies as described herein. The non-processor circuits may include, but are not limited to, a radio receiver, a radio transmitter, signal drivers, clock circuits, power source circuits, and user input devices. As such, functions may be interpreted as steps of a method to perform heterogeneous radio access technology communication. Alternatively, some or all functions could be implemented by a state machine that has no stored program instructions, or in one or more application specific integrated circuits, in which each function or some combinations of certain of the functions are implemented as custom logic. Of course, a combination of the two approaches could be used. Thus, methods and means for these functions have been described herein. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and circuits with minimal experimentation.

Embodiments of the invention are now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on." Relational terms such as first and second, top and bottom, and the like may be used solely to distinguish one entity or action from another entity or action without necessarily requiring or implying any actual such relationship or order between such entities or actions. Also, reference designators shown herein in parenthesis indicate components shown in a figure other than the one in discussion. For example, talking about a device (10) while discussing figure A would refer to an element, 10, shown in figure other than figure A.

During certain situations in travel, for example when leaving the service of a first communication system and entering the service of a second system, a mobile device needs to monitor the signals of the cells, towers, or base stations belonging to the new system, referred to herein as "adjacent cells", so that a controlled transition of telephone calls or data transmission can occur between the two systems. Described and illustrated herein is a method and apparatus for communicating with a first system while monitoring a second without the need of employing duplicative, redundant circuits.

The method and apparatus employ a single system clock that is frequency synchronized only to a serving cell, tower, or base station, referred to herein as a "serving cell". A "system clock" as used herein refers to a single frequency reference signal that is time-base synchronized to a network. A frequency synthesizer, such as a fractional-N phase locked loop, is then frequency synchronized with either the serving cell or an adjacent cell on an as needed basis. For instance, when the device is communicating with the serving cell, the frequency synthesizer is synchronized with the serving cell. When monitoring an adjacent cell, the frequency synthesizer is synchronized and frequency corrected to the adjacent cell without altering the system clock synchronization.

As will be described herein, adjacent cell monitoring may occur during periods where current communication will not be interrupted. This monitoring may occur during predefined idle periods such as compressed mode gaps and idle frames present in some radio access technology communication schemes. For example, in a WCDMA environment, monitoring may be performed during a WCDMA compressed mode gap. In a GSM environment, monitoring may be performed during a GSM idle frame or idle slot. Frequency synchronization updates may occur at the beginning of the idle periods during receiver configuration or warm-up in order to minimize the impact of synthesizer locking and time base drift.

By separating a frequency correction capability of the system clock from a frequency correction capability of the radio frequency synthesizer, the system clock may remain synchronized to the serving cell when the radio frequency synthesizer synchronizes with and is used to monitor the adjacent cell. Since this system clock remains unchanged while monitoring adjacent cells, no timing errors are introduced by the system clock when the radio frequency synthesizer is corrected to monitor the adjacent cell. As such, there is no need to use elaborate or redundant hardware or software to correct errors introduced into the serving cell time base. As the time base for any radio access technology varies proportionally with the inverse of the frequency of the system clock, any error in the system clock can cause drift in the time base. Thus, a communication device may open a receive window too early or too late for an incoming packet. The separation of the frequency correction of the system clock and the radio frequency synthesizer ensures that these time base errors do not occur.

To assist in describing and illustrating embodiments of the invention, two radio access technologies, GSM and WCDMA, will be used as examples. It will be clear to those of ordinary skill in the art having the benefit of this disclosure, however, that other communication systems and standards, such as the DigRF interface standard, may be used in conjunction with the invention. Further, mobile telephones will be used herein as exemplary electronic communication devices, but embodiments of the invention could equally be applied to other two-way communication devices configured to communicate with cellular systems to transfer voice and data.

As described herein, a multimode communication device is capable of frequency synchronization with multiple radio access technology networks. To provide reliable communication capability, the multimode device is capable of frequency correction for the various frequency errors and Doppler shifts when monitoring adjacent cells. Embodiments of the invention take advantage of the fact that a device that is frequency synchronized with one radio access technology can use the same frequency synchronization information for monitoring a second radio access technology network. Consequently, the system clock may stay synchronized with a serving cell while a frequency synthesizer is used to monitor an adjacent cell.

Using GSM and WCDMA networks as examples, both radio access technologies have an absolute frequency accuracy requirement of +/−0.05 ppm. Devices configured to communicate with these radio access technologies must be able to maintain 0.1 ppm accuracy relative to the signal received from the network with which the device is communicating. In the case of a mobile telephone, when the mobile telephone is engaged in a call with a GSM network and needs to monitor a WCDMA cell, the device may employ frequency correction information from the GSM cell to monitor the WCDMA cell. This frequency correction information, which may be applied to the synthesizer or may be applied later in a digital signal processing algorithm as will be shown below, may be used to correct the frequency error associated with, for example, the adjacent cell.

Turning now to FIG. 1, illustrated therein is one embodiment of a communication device 100 in communication with a first radio access technology network 101. The first radio access technology network 101 comprises a plurality of access nodes, e.g. access nodes 107,108, configured in accordance with the first radio access technology. Any of the plurality of access nodes 107,108 may serve as a serving cell 102 to the communication device 100.

For example, in FIG. 1, the communication device 100 is engaged in a call 105 with serving cell 102. Presuming for the moment that the communication device 100 is moving away from the first radio access technology network 101, the communication device 100 must monitor 106 an adjacent cell 104 in a second radio access technology network 103 to make an orderly handoff of the call 105 from the serving cell 102 to the adjacent cell 104. The second radio access network 103 comprises a second plurality of access nodes, e.g. access nodes 109,110, configured in accordance with the second radio access technology. In the embodiment of FIG. 1, the first radio access technology network 101 may be a GSM network for example, while the second radio access technology network 103 may be a WCDMA network, or vice versa.

Figure 2:
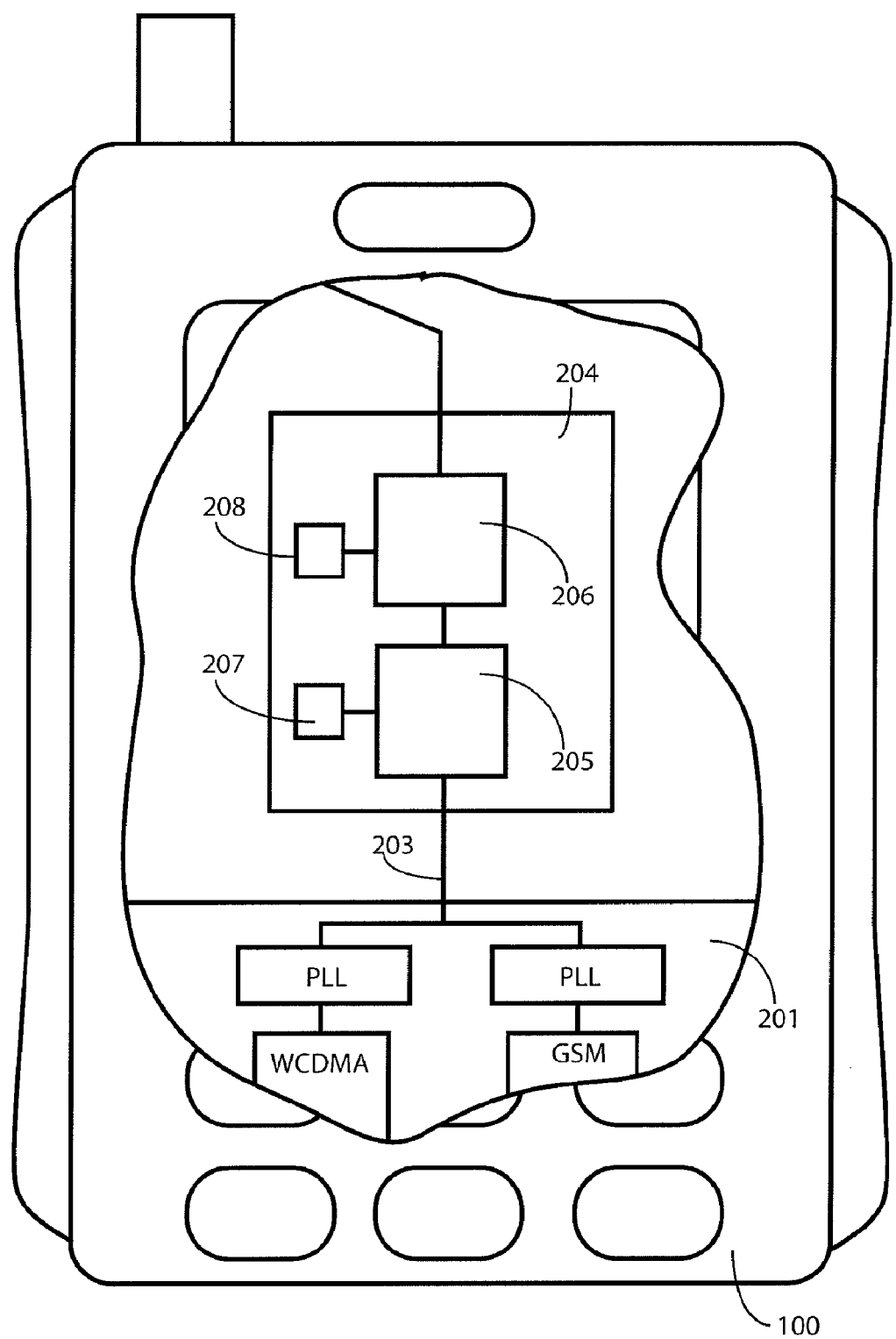
FIG. 2 illustrates a schematic block diagram of a multimode device in accordance with one embodiment of the invention.

Turning now to FIG. 2, illustrated therein is a schematic block diagram of one embodiment of a communication device 100 in accordance with the invention. The communication device 100 includes core circuitry 201 including separate WCDMA and GSM layer (network) timers and system control configured to utilize a single system clock 203 derived from a single system clock signal. This single system clock 203, which for example may be between 19 and 40 MHz, is generated by a communication circuit 204. In one embodiment, the communication circuit 204 includes a first synchronization device 205 and a second synchronization device 206. The first synchronization device 205 is configured to frequency synchronize the single system clock 203 with a carrier signal received from a serving cell (102). The second synchronization device 206 is configured to frequency synchronize a modulation or demodulation of a carrier signal, which may be received from either the serving cell (102) or an adjacent cell (104).

Separate frequency correction modules 207,208 are provided for the first synchronization device 205 and the second synchronization device 206. Shown generally as blocks, as the implementation of the frequency correction modules 207, 208 may vary as will be described below. Frequency correction module 207 is used to apply a correction to the first synchronization device 205, while frequency correction module 208 is used to apply a correction to the second synchronization device 206. By separating the frequency correction modules 207,208, the first synchronization device 205 can remain synchronized with the serving cell (102) while the second synchronization device 206 may be configured to synchronize with either the serving cell (102) or an adjacent cell (104), even where the serving cell (102) and adjacent cell (104) represent different radio access technologies. When the first synchronization device 205 is configured to synchronize the system clock 203 with a carrier signal associated with a serving cell (102) having a first radio access technology, and the second synchronization device 206 is configured to synchronize the communication circuit 204 with a carrier signal of the second radio access technology, frequency correction module 208 may frequency correct the second synchronization device 206 while leaving the first synchronization device 205 unchanged.

In one embodiment, the first synchronization device 205 and second synchronization device 206 each comprise a fractional-N digital phase locked loop. Fractional-N phase-locked loop frequency synthesis is a known technique for generating one of many related signals from a frequency variable voltage controlled oscillator.

In a conventional single loop phase locked loop, an output signal from the voltage controlled oscillator is coupled to a programmable frequency divider. The programmable frequency divider divides by a selected integer number to provide a frequency divided signal to a phase detector. The phase detector compares the frequency divided signal to a reference signal from another fixed frequency oscillator, which often is selected for stability of frequency over time and environmental changes. Any difference in phase between the frequency divided signal and the reference signal is output from the phase detector, coupled through a loop filter, and applied to the voltage controlled oscillator in a manner that causes the output signal from the voltage controlled oscillator to change in frequency such that the phase error between the frequency divided signal and the reference signal is minimized. Since the programmable divider divides by integers only, the output frequency step is constrained to be equal to the reference signal frequency.

As described in U.S. Pat. No. 5,111,162 to Hietala et al., issued May 5, 1992, entitled "Digital frequency synthesizer having AFC and modulation applied to frequency divider," a fractional-N frequency synthesizer may be used to overcome the limitations associated with a single loop phase locked loop. A fractional-N frequency synthesizer includes frequency dividers capable of effectively dividing by non-integers. Output frequency step sizes are fractions of the reference signal frequency, and are obtained while maintaining a high reference frequency and wide loop bandwidth. A further discussion of fractional-N frequency synthesizers may be found in U.S. Pat. No. 4,816,774 to Martin, issued Mar. 28, 1989, entitled "Frequency synthesizer with spur compensation."

Control of the divisor of a programmable frequency divider is usually maintained by way of a multiple bit binary number applied to the programmable frequency divider. The binary number for a fractional-N synthesizer is created in a digital network and coupled to the programmable frequency divider. Description of divider controls may be found in U.S. Pat. No. 5,055,800 to Black et al., issued Oct. 8, 1991, entitled "Fractional N/M synthesis"; U.S. Pat. No. 5,093,632 to Hietala et al., issued Mar. 3, 1992, entitled "Latched accumulator fractional N synthesis with residual error reduction,"; and U.S. Pat. No. 5,070,310 to Hietala et al., issued Dec. 3, 1991, entitled "Multiple latched accumulator fractional N synthesis."

In one embodiment, both the first synchronization device 205 and the second synchronization device 206 may be incorporated into a single integrated circuit. Such a single circuit provides convenience of manufacture and increased cooperation between the first synchronization device 205 and the second synchronization device 206 in that connections between the two are short and dedicated within the single integrated circuit.

Figure 3:
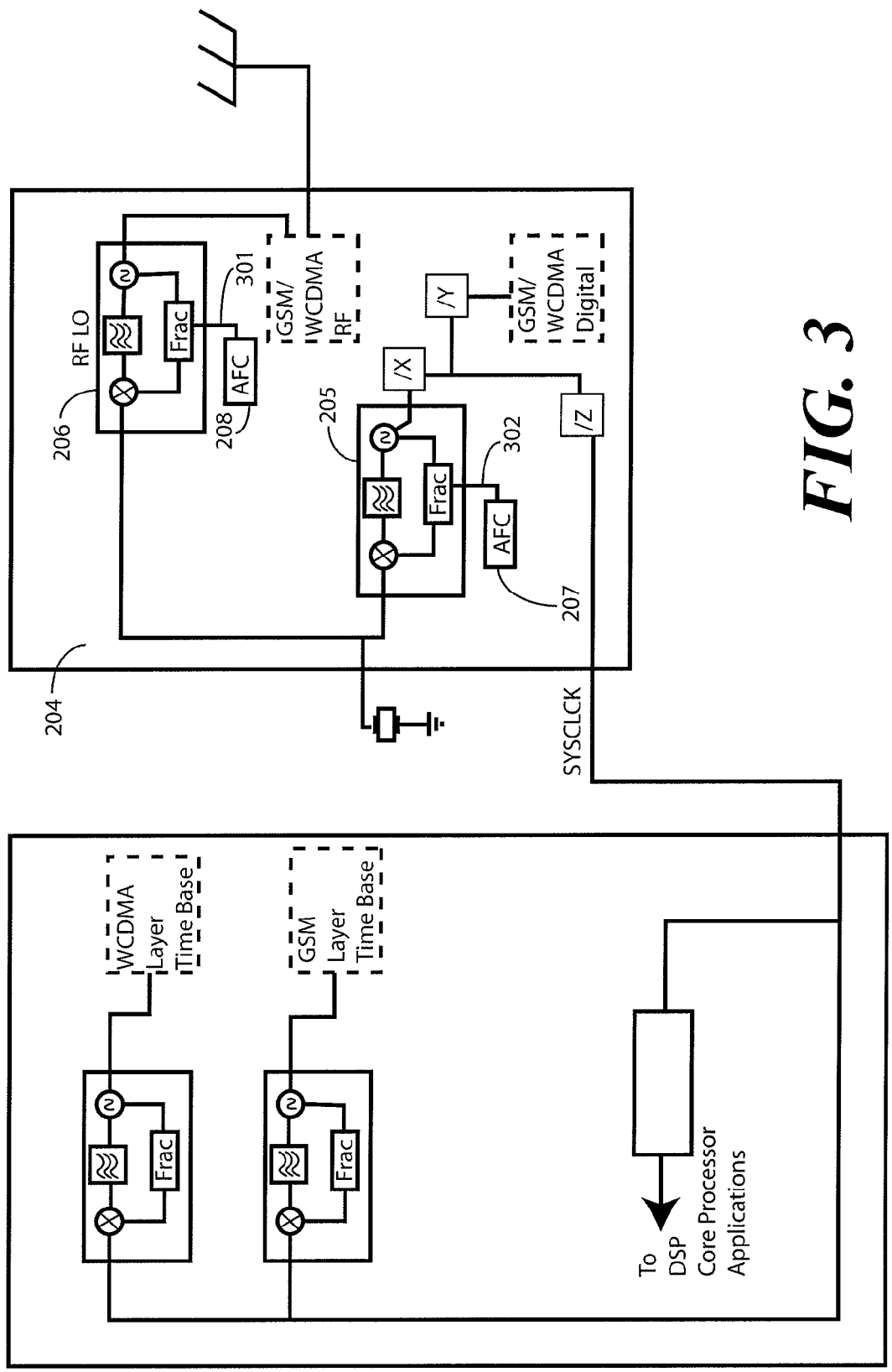
FIG. 3 illustrates one embodiment of a multimode apparatus having a single system clock configured to communicate with multiple radio access technologies in accordance with one embodiment of the invention.

Turning now to FIG. 3, illustrated therein is a more detailed schematic diagram of a communication device in accordance with one embodiment of the invention. The illustration of FIG. 3 shows in more detail how frequency correction may be performed on either the first synchronization device 205 or second synchronization device 206 in the communication circuit 204. Frequency correction is generally achieved by automatically causing fine corrections to the frequency of a reference oscillator based upon a higher stability standard. For example, one prior art solution for automatic frequency correction from an external standard is described in U.S. Pat. No. 4,887,050 to Borth et al., issued Dec. 12, 1989, entitled "Frequency control apparatus and method for a digital radio receiver," in which a frequency offset between a received signal and a digital receiver local oscillator is corrected in substantially one step. In embodiments of the present invention, frequency correction may be achieved in multiple ways. Each of these methods will now be described in detail.

In the illustrative embodiment of FIG. 3, the second synchronization device 206 comprises a fractional-N frequency synthesizer, which includes a control node 301. A frequency correction module 208 is coupled to the control node 301 of the second synchronization device, and is capable of making fine corrections to the second synchronization device as needed.

In one embodiment, the frequency correction module 208 corrects the second synchronization device 206 according to the cell of interest, which may be either the serving cell (102) or an adjacent cell (104). When monitoring an adjacent cell (104) for example, a frequency offset between a received modulation signal and a digital receiver local oscillator is corrected by updating the frequency correction values based upon prior adjacent cell frequency error measurements.

In another embodiment, the frequency correction module 208 comprises a digital signal processing circuit configured to digitize a signal received from an adjacent cell (104). This digitized receive signal is then demodulated. A frequency correction value is applied to the digitized received signal in an iterative process, thereby frequency correcting the second synchronization module 206.

Figure 4:
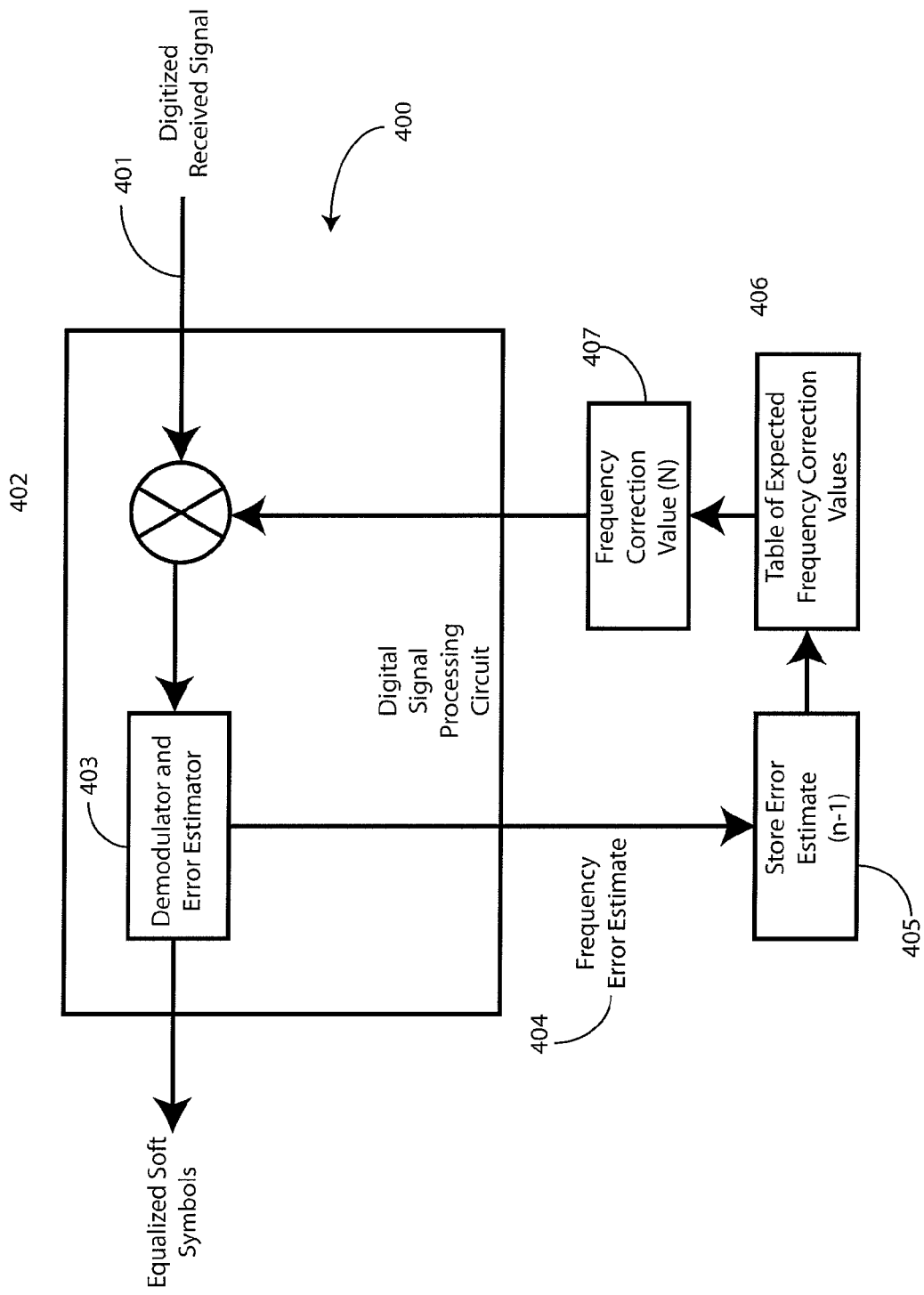
FIG. 4 illustrates one embodiment of a digitized frequency correction system in accordance with one embodiment of the invention.

Turning briefly to FIG. 4, illustrated therein is a feedback loop 400 suitable for use in a digital signal processing circuit to perform error correction to a digitized received signal 401. The digitized received signal 401 is delivered to a processing module 402, such as a digital signal processor, programmable logic, or other hardware. The digitized received signal 401 is then demodulated in a demodulator 403.

A frequency error estimate factor 404 is also calculated and stored 405 in memory. In one embodiment, the frequency error estimate factor 404 is calculated by comparing at least a portion of a digitized received signal with a known reference. For example, in GSM networks, reference signals are periodically transmitted from a serving cell to the device. Since the values of these reference packets are known, received representations of these packets may be compared with a known reference to determine an error estimate.

From this frequency error estimate factor 404, a corresponding frequency correction value may be found in a look-up table 406. This frequency correction value 407 is then modulated into the received signal to perform the frequency correction. The values in the look-up table 406 may be iteratively revised, such that the loop 400 becomes more accurate across time.

Turning back to FIG. 3, the first synchronization device 205 is frequency corrected independent of the second synchronization device 206. As with the frequency correction of the second frequency correction device 206, the frequency correction of the first synchronization device 205 may be accomplished in multiple ways.

The embodiment of FIG. 3 illustrates a first method of frequency correcting the first synchronization device 205, where the first synchronization device 205 comprises a fractional-N frequency synthesizer. As with the second synchronization device 206, in this embodiment frequency correction is accomplished by coupling the frequency correction module 207 to a control node 302 of the first synchronization device 205. The frequency correction module 207 then applies a correction factor to the feedback loop of the fractional-N synthesizer, thereby correcting frequency in a conventional manner. This frequency correction is applied to the first synchronization device 205 so it is synchronized with the carrier frequency of the serving cell.

Figure 5:
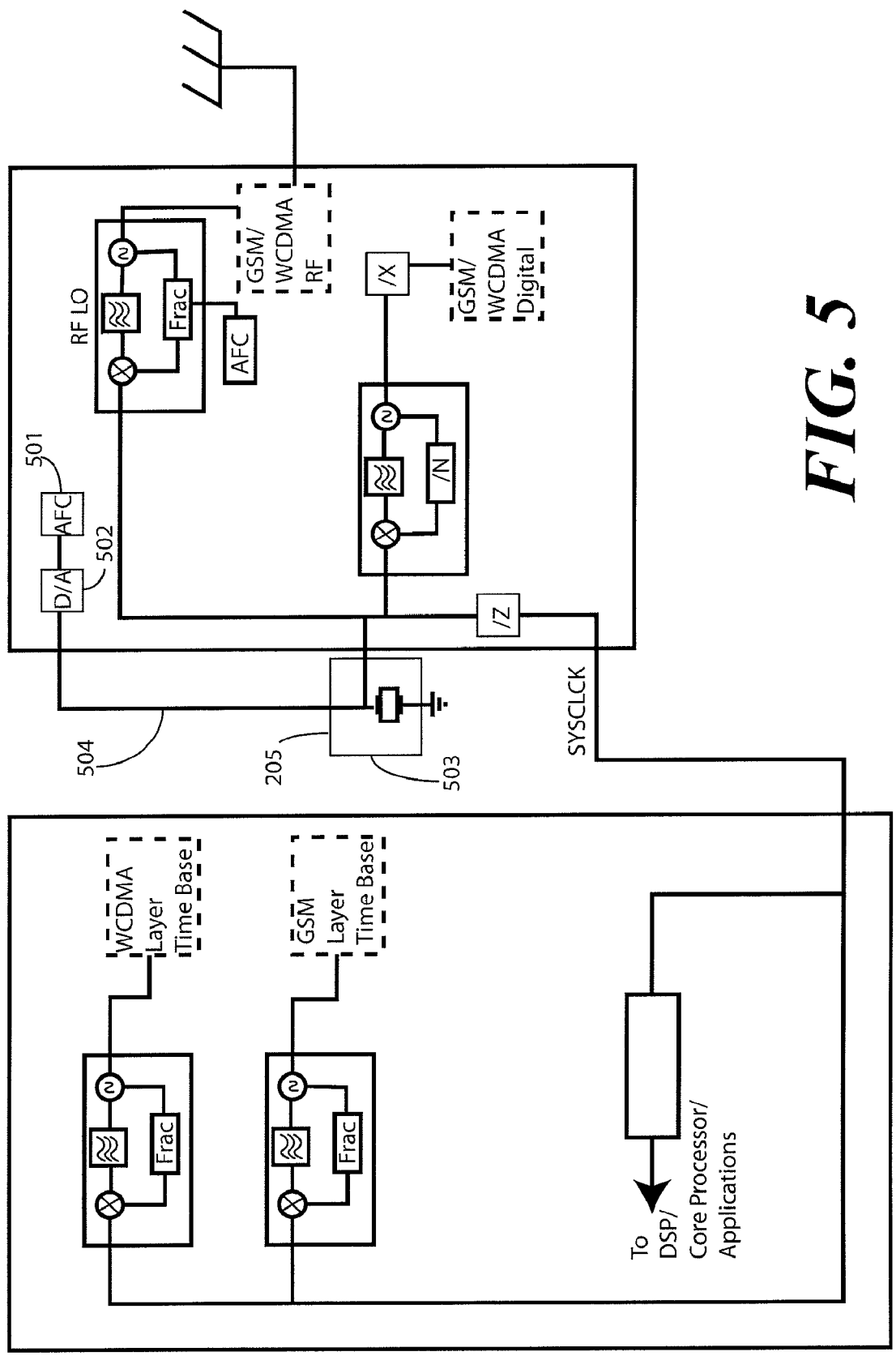
FIG. 5 illustrates another embodiment of a multimode apparatus having a single system clock configured to communicate with multiple radio access technologies in accordance with one embodiment of the invention.

Turning now to FIG. 5, illustrated therein is an alternate method for frequency correcting the first synchronization device 205. While the embodiment of FIG. 3 illustrated the first synchronization device 205 as a fractional-N frequency synthesizer, the embodiment of FIG. 5 employs a voltage controlled crystal oscillator as the first synchronization device. In the embodiment of FIG. 5, rather than applying a correction value to a phase lock loop feedback divider, the system clock is corrected by a technique known as "warping the oscillator."

In the exemplary embodiment of FIG. 5, the first synchronization device 205 is shown as a voltage controlled temperature compensated crystal oscillator 503 (VCTCXO). A voltage controlled temperature compensated crystal oscillator 503 is an accurate oscillator that allows the frequency range to be specified in terms of parts per million. Since the voltage controlled temperature compensated crystal oscillator 503 is voltage based, minor corrections may be performed by slightly adjusting a reference voltage 504. For instance, for fine resolution, a digital frequency correction device 501 may generate a high-resolution value that is coupled to a digital to analog converter 502. This digital to analog converter 502 then delivers the reference voltage 504 to the voltage controlled temperature compensated crystal oscillator 503. By adjusting the output of the digital frequency correction device 501, the corresponding reference voltage 504 changes, thereby slightly altering the frequency of the voltage controlled temperature compensated crystal oscillator 503.

Another method of warping the oscillator occurs when using an alternate type of oscillator. Rather than using a voltage controlled temperature compensated oscillator, a digitally controlled oscillator (DXO) may be used. A digitally controlled oscillator is "warped" by loading the oscillator by way of a digital control word. Loading may be achieved on-chip by adjusting capacitances in a switched capacitor circuit in accordance with the digital control word so as to load the digitally controlled oscillator directly, thereby slightly adjusting its frequency. In such an embodiment, the analog to digital converter 502 is not required. Either of these methods of "warping" of the oscillator may be used as one method for correcting the frequency of the first synchronization device 205.

Thus, to recap, in accordance with one embodiment of the invention, frequency correction is applied to the first synchronization device 205 and second synchronization device 206 independently. Thus, the first synchronization device 205 may remain synchronized with the serving cell (102) while the second synchronization device 206 synchronizes with the cell of interest, be it the serving cell (102) or an adjacent cell (104). Further, frequency correction may be applied to the first synchronization device 205 by either warping the oscillator or by applying a correction value to the feedback loop of a fractional-N frequency synthesizer. Frequency correction of the second synchronization device 206 may be applied either by applying a correction value to the feedback loop of a fractional-N frequency synthesizer or by correcting frequency digitally in a digital signal processor.

Figure 6:
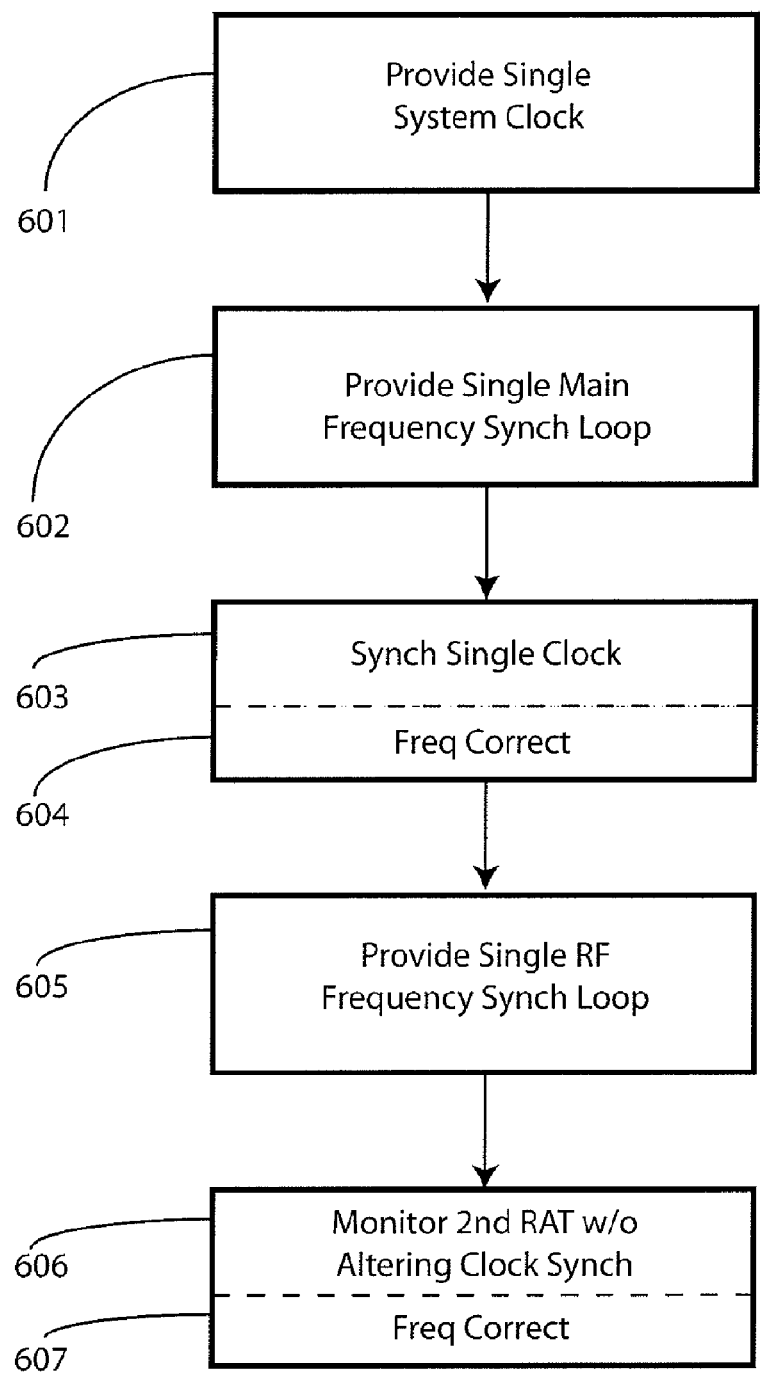
FIG. 6 illustrates one method of monitoring a heterogeneous radio access technology using a single system clock in accordance with one embodiment of the invention.

Turning now to FIG. 6, illustrated therein is a method for monitoring a heterogeneous radio access technology while communicating with a first radio access technology. The method outlines steps for monitoring an adjacent cell (104) while communicating with a serving cell (102) as is illustrated above with respect to FIGS. 1-5. Thus, method steps restating hardware functions recited above will be set forth briefly without additional explanation.

At step 601, a communication device (100) having a single system clock capable of synchronizing with at least two radio access network technologies is provided. Per the discussion above, one radio access technology may be a GSM network, while a second radio access technology may be a WCDMA network. Also, as described above, in one embodiment the single system clock comprises a voltage controlled temperature compensated crystal oscillator (503).

At step 603, the single system clock is synchronized with a first network (101) employing a first radio access technology. In one embodiment, the single system clock is synchronized with a carrier signal associated with an access node or serving cell (102) in the first network (101). This synchronization may include the use of a first synchronization device (205), such as the voltage controlled temperature compensated crystal oscillator 503 of FIG. 5 or the fractional-N frequency synthesizer of FIG. 3. Thus, a single main frequency synchronization loop may be provided at step 602.

The step 603 of synchronizing includes the application of a frequency correction to the single main frequency synchronization loop. As such, step 603 includes the step 604 of frequency correcting the single system clock by the main frequency synchronization loop. The frequency correction may be accomplished by warping the oscillator or by directly applying frequency correction to a fractional-N frequency synthesizer as described above.

At step 606, while the single system clock remains synchronized with the first network (101), the communication device (100) monitors a second network (103) employing a second radio access technology. To accomplish the step of monitoring the second network (103), a single radio frequency synchronization loop, such as a fractional-N frequency synthesizer, may be provided at step 605.

As with synchronization of the single system clock, the step 606 of monitoring the second network may include the step 607 of frequency correcting the single radio frequency synchronization loop. For example, the single radio frequency synchronization loop may be frequency corrected in accordance with the carrier signal from the second network (103) while the communication device (100) is monitoring the second network (103). As noted above, the step 607 of frequency correcting the single radio frequency synchronization loop may be accomplished in a discrete domain by digitizing a signal received from the monitored network as a digitized received signal and applying a frequency correction value to the digitized received signal in a digital signal processor as described in FIG. 4. Alternatively, the frequency correction may be accomplished by applying a correction value in accordance with the carrier signal associated with the monitored radio access technology to the feedback loop of a fractional-N frequency synthesizer.

In one embodiment, the step 607 of frequency correcting the single radio frequency synchronization loop with the second network occurs while the single system clock remains synchronized with the first radio access technology. Thus, the communication device (100) employs the single system clock, synchronized with the carrier signal associated with the serving cell (102) of the first network (101), while monitoring the second network (103), which employs a heterogeneous radio access technology.

Figure 7:
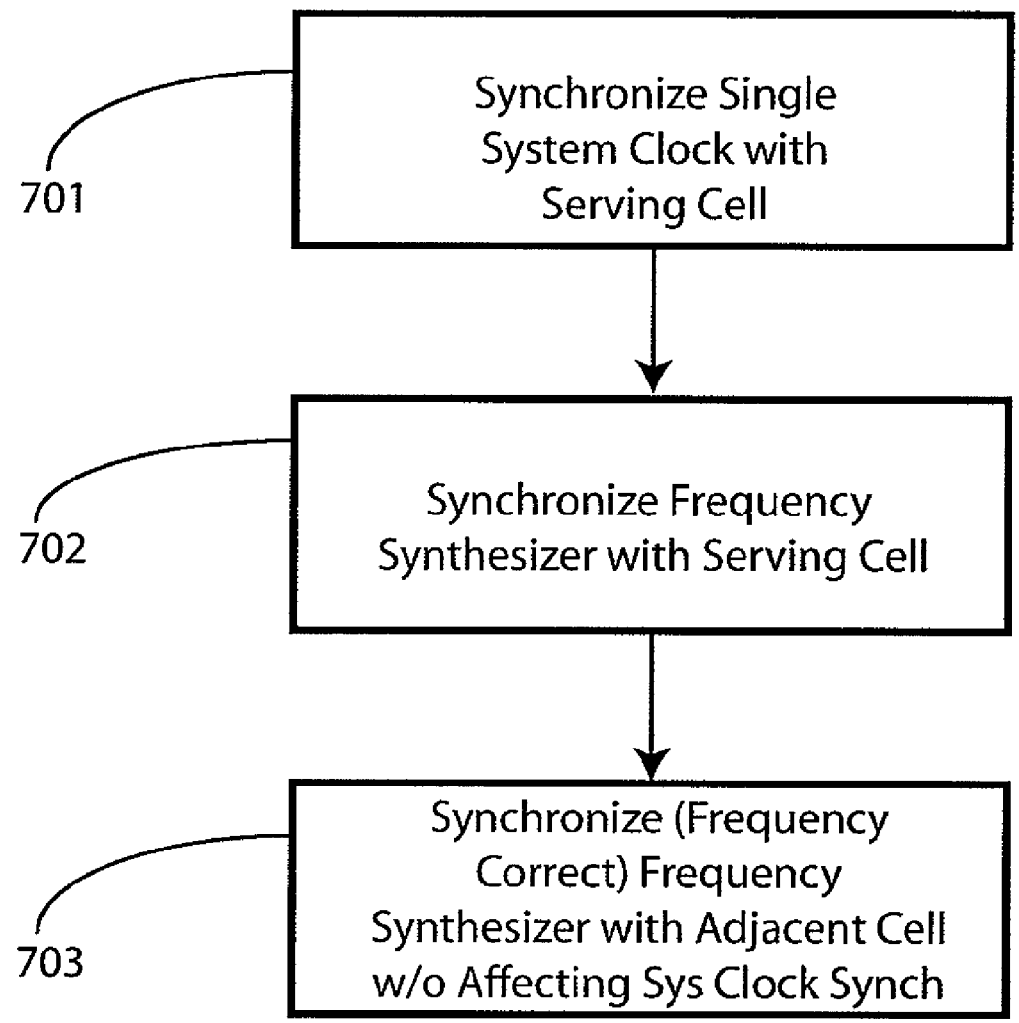
FIG. 7 illustrates one method of accessing multiple radio access technologies with a single system clock in accordance with one embodiment of the invention.

As noted above, the method of FIG. 6 is suitable for use in a communication device configured to transmit voice, data, and combinations thereof to a network using access nodes, cells, or base stations. One such device is within a mobile telephone, such as a multimode device configured to communicate with different networks, such as GSM and WCDMA. Turning now to FIG. 7, illustrated therein is a more detailed method for accessing multiple radio access technologies with a single system clock in accordance with one embodiment of the invention.

At step 701, the single system clock is synchronized with a carrier signal from a serving cell (102) or serving access node. This serving cell (102) is associated with a first radio access technology. The step of synchronizing the single system clock with the carrier signal may include one of applying a system clock correction factor to a fractional-N phase locked loop or warping the oscillator by altering a control voltage associated with a voltage controlled oscillator.

At step 702, a frequency synthesizer is synchronized with a carrier signal received from the serving cell (102). In this state, the mobile telephone is in full communication with the serving cell (102), as would be the case while conducting a voice call with the first radio access technology network.

At step 703, the first time an adjacent cell (104) is monitored, the frequency synthesizer maintains the correction value for synchronization with the serving cell (102). A measurement of the frequency error of a carrier signal from a second access node associated with a second radio access technology, i.e. an adjacent cell (104) is determined to be used for synchronization with the adjacent cell (104) during subsequent monitoring. During subsequent monitoring of the adjacent cell (104), the frequency synthesizer is synchronized utilizing correction values determined during previous monitoring of the adjacent cell (104). This synchronization is done while the single system clock remains synchronized with the carrier signal received from the serving cell (102). This occurs independent of system clock synchronization. Said differently, this frequency correction of the frequency synthesizer occurs while the single system clock remains synchronized to the serving cell.

As noted above, step 703 may be accomplished either through digital signal processing or directly. Using digital signal processing, step 703 may include one of applying a frequency correction factor to a demodulated, digitized signal received from the second access node or applying a frequency correction adjustment value to the frequency synthesizer.

In the foregoing specification, specific embodiments of the present invention have been described. However, one of ordinary skill in the art appreciates that various modifications and changes can be made without departing from the scope of the present invention as set forth in the claims below. Thus, while preferred embodiments of the invention have been illustrated and described, it is clear that the invention is not so limited. Numerous modifications, changes, variations, substitutions, and equivalents will occur to those skilled in the art without departing from the spirit and scope of the present invention as defined by the following claims. Accordingly, the specification and figures are to be regarded in an illustrative rather than a restrictive sense, and all such modifications are intended to be included within the scope of present invention.

What is claimed is:

1. A method for monitoring a heterogeneous radio access technology, the method comprising:

providing in an electronic device a single system clock having a single frequency reference signal capable of synchronization with at least two radio access network technologies;

synchronizing the single system clock with a carrier signal of a first network employing a first radio access technology and applying a first frequency correction for the first radio access technology to the system clock;

while the single system clock remains synchronized with the first network:

monitoring a second network employing a second radio access technology by synchronizing a frequency synthesizer coupled to the single system clock with a carrier signal of the second network without altering synchronization of the system clock with the first network; and applying, independent of the first frequency correction, a second frequency correction for the second radio access technology to the frequency synthesizer while leaving the single system clock unchanged.

2. The method of claim 1, further comprising providing a single main frequency synchronization loop coupled to the single system clock, wherein the step of synchronizing the single system clock with the first network comprises the step of frequency correcting the single system clock by the single main frequency synchronization loop in accordance with the first radio access technology.

3. The method of claim 2, wherein the single system clock comprises a fractional-N frequency synthesizer, wherein the step of frequency correcting the single system clock comprises the step of applying a frequency correction to the fractional-N frequency synthesizer.

4. A communication circuit capable of communication with at least a first radio access technology and a second radio access technology, the communication circuit comprising:
   a single system clock;
   a first synchronization device configured to synchronize the single system clock with a carrier signal;
   a second synchronization device, operable from the single system clock, and configured to synchronize the communication circuit with a carrier signal and apply a second frequency correction, independent of the first frequency correction, to the communication circuit while leaving the single system clock unchanged; and
   a first frequency correction module configured to and apply a first frequency correction to the single system clock; and
   a second frequency correction module, wherein upon the first synchronization device synchronizing the single system clock with a carrier signal associated with the first radio access technology and the second synchronization device synchronizing the communication circuit with a carrier signal of the second radio access technology, the frequency correction module corrects the second synchronization device independently from the first frequency correction module, thereby leaving the first synchronization device and single system clock unchanged.

5. The communication circuit of claim 4, wherein the first synchronization device comprises one of a fractional-N frequency synthesizer or a warped oscillator, the second synchronization device comprises a fractional-N frequency synthesizer.

6. The communication circuit of claim 5, wherein the frequency correction module is coupled to a control node of the fractional-N frequency synthesizer.

7. The communication circuit of claim 4, wherein the frequency correction module comprises a digital signal processing circuit configured to digitize a signal received from the second radio access technology as a digitized received signal and apply a frequency correction value to the digitized received signal.

8. A method in a mobile telephone for accessing more than one radio access technology with a single system clock, the method comprising:
   synchronizing the single system clock with a carrier signal received from a serving access node associated with a first radio access technology and applying a first frequency correction to the single system clock;
   synchronizing a frequency synthesizer with a carrier signal received from the serving access node; and
   while the single system clock remains synchronized with the carrier signal received from the serving access node, applying a second frequency correction, independent from the first frequency correction to the frequency synthesizer for a carrier signal received from the second access node associated with the second radio access technology while leaving the single system clock unchanged.

9. The method of claim 8, wherein applying the frequency correction comprises one of applying a frequency correction factor to a demodulated, digitized signal received from the second access node or applying a frequency correction adjustment value to the frequency synthesizer.

10. The method of claim 9, wherein synchronizing the single system clock with the carrier signal comprises one of applying a system clock correction factor to a fractional-N frequency synthesizer, altering a control voltage associated with a voltage controlled oscillator, or loading an oscillator.

* * * * *